(12) United States Patent
Su et al.

(10) Patent No.: US 8,546,914 B2
(45) Date of Patent: Oct. 1, 2013

(54) EMBEDDED CAPACITOR STRUCTURE AND THE FORMING METHOD THEREOF

(75) Inventors: Hao Su, Singapore (SG); Hang Hu, Singapore (SG); Hong Liao, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/185,551

(22) Filed: Jul. 19, 2011

(65) Prior Publication Data
US 2013/0020677 A1 Jan. 24, 2013

(51) Int. Cl.
*H01L 51/05* (2006.01)
(52) U.S. Cl.
USPC ............................. 257/532; 257/301; 438/253
(58) Field of Classification Search
USPC ........................................................ 257/301
See application file for complete search history.

(56) References Cited

U.S. PATENT DOCUMENTS

| | | | | |
|---|---|---|---|---|
| 6,664,581 B2* | 12/2003 | Stamper | | 257/301 |
| 6,794,262 B2* | 9/2004 | Ning et al. | | 438/396 |
| 6,894,331 B2* | 5/2005 | Yoshitomi et al. | | 257/296 |
| 6,992,344 B2* | 1/2006 | Coolbaugh et al. | | 257/301 |
| 7,002,201 B2* | 2/2006 | Yasuda | | 257/306 |
| 7,071,057 B2* | 7/2006 | Park | | 438/253 |
| 7,223,654 B2* | 5/2007 | Yang et al. | | 438/253 |
| 8,093,637 B2* | 1/2012 | Engelhardt et al. | | 257/296 |
| 2001/0020713 A1* | 9/2001 | Yoshitomi et al. | | 257/306 |
| 2003/0164514 A1 | 9/2003 | Stamper | | |
| 2004/0113235 A1* | 6/2004 | Coolbaugh et al. | | 257/532 |
| 2007/0111431 A1* | 5/2007 | Engelhardt et al. | | 438/253 |
| 2007/0117313 A1* | 5/2007 | Yang et al. | | 438/253 |
| 2009/0305478 A1* | 12/2009 | Yang | | 438/393 |
| 2011/0210422 A1* | 9/2011 | Imamura et al. | | 257/532 |
| 2012/0122293 A1* | 5/2012 | Coolbaugh et al. | | 438/396 |

\* cited by examiner

*Primary Examiner* — Chuong A Luu
*Assistant Examiner* — Jaehwan Oh
(74) *Attorney, Agent, or Firm* — Ding Yu Tan

(57) ABSTRACT

A method for forming an embedded capacitor structure is provided. Firstly, a first dielectric layer having a trench therein on a substrate is provided. A capacitor structure is formed on the bottom surface of the trench. The capacitor structure includes a first metal layer, a capacitance-insulating layer and a second metal layer and the portion surface of the first metal layer on the bottom surface of the trench is exposed. A cap layer is formed on the top surface and the inner surface of the trench and on the capacitor structure. A second dielectric layer is formed on the cap layer. The portion of second dielectric layer and the portion of the cap layer are removed to form a plurality of contact windows therein, and the portion surface of the first metal layer and the portion surface of the second metal layer are exposed by the plurality of contact windows.

21 Claims, 3 Drawing Sheets

EMBEDDED CAPACITOR STRUCTURE AND THE FORMING METHOD THEREOF

FIELD OF THE INVENTION

The present invention relates to an embedded capacitor structure, and more particularly to a process for forming an embedded capacitor structure using only one silicon nitride deposition process.

BACKGROUND OF THE INVENTION

The purpose of the integrated circuit is to integrate the various types of electronic components to the semiconductor substrate by miniaturization. Thus, the capacitor must be completed in the integrated circuit in demand. However, the conventional process of the embedded capacitor is too complicated, for example, it need to be repeated at different stages of silicon nitride deposition process in order to complete the structure of the conventional capacitor, so that the cost of the manufacturing process is higher. Thus, the purpose of the present invention is to improve the lack of the conventional embedded capacitor structure.

SUMMARY OF THE INVENTION

The object of the present invention is to provide a method for forming an embedded capacitor structure, such that the number of the silicon nitride layer deposition processes can be diminished to reduce the manufacturing cost. In accordance with the object, the present invention provides a method for forming an embedded capacitor structure. Firstly, a first dielectric layer having a trench therein on a substrate is provided. A capacitor structure is formed on the bottom surface of the trench. The capacitor structure includes a first metal layer, a capacitance-insulating layer and a second metal layer and the portion surface of the first metal layer on the bottom surface of the trench is exposed. A cap layer is formed on the top surface and the inner surface of the trench and on the capacitor structure. A second dielectric layer is formed on the cap layer. The portion of second dielectric layer and the portion of the cap layer are removed to form a plurality of contact windows therein, and the portion surface of the first metal layer and the portion surface of the second metal layer are exposed by the plurality of contact windows.

In an embodiment, the material of the first dielectric layer is made of silicon dioxide or Fluorinated Silica Glass (FSG).

In an embodiment, the capacitor structure further includes the steps of forming a first metal layer on the top surface, the inner surface and the bottom surface of the trench, forming the capacitor layer on a surface of the first metal layer, forming the second metal layer on a surface of the capacitance-insulating layer, forming a bottom anti-reflection coating layer on the second metal layer and to fill with the trench, forming a photoresist layer with the capacitor structure pattern over the bottom anti-reflection coating layer; and etching to remove the bottom anti-reflection coating layer, the portion of the second metal layer, the portion of the capacitance-insulating layer and the portion of the first metal layer to form the capacitor structure on the bottom surface of the trench, and to expose the portion surface of the first metal layer and the portion surface of the second metal layer on the bottom surface of the trench.

In an embodiment, the material of the bottom anti-reflection coating layer is made of silicon nitride (SiN), silicon dioxide ($SiO_2$) or silicon oxynitride (SiON).

In an embodiment, the first metal layer on the bottom surface of the trench is contacted with the portion inner surface of the trench.

In an embodiment, the first metal layer with a thickness is in a range around 1000 angstroms.

In an embodiment, the capacitance-insulating layer with a thickness is in a range from 300 angstroms to 600 angstroms.

In an embodiment, the second metal layer with a thickness is in a range from 600 angstroms to 1000 angstroms.

In an embodiment, the cap layer with a thickness is in a range from 350 angstroms to 700 angstroms.

In an embodiment, the contact window is a single damascene structure or a dual damascene structure.

In an embodiment, the method for forming an embedded structure further includes the step of forming a metal layer in the plurality of contact windows to form a plurality of conductive connecting structures.

According to the method for forming the embedded capacitor structure, the present invention provides an embedded capacitor structure. The embedded capacitor structure includes a first dielectric layer on the substrate and a trench in the first dielectric layer, a capacitor structure on the bottom surface of the trench. The capacitor structure includes a first metal layer on the bottom surface of the trench, a capacitance-insulating layer on the first metal layer and a second metal layer on the capacitance-insulating layer. The capacitance-insulating layer and the second metal layer exposed the portion surface of the first metal layer and there is a distance between the capacitance-insulating layer and the second metal layer and the inner surface of the trench. A cap layer is formed on the inner surface of the trench and covered on the capacitance-insulating layer. A second metal layer is formed on the cap layer. A plurality of conductive connecting structures is formed within the second dielectric layer and the cap layer, wherein the portion of the plurality of conductive connecting structures is electrically connected with the portion exposed surface of the first metal layer and another portion of the plurality of conductive connecting structures is electrically connected with the portion exposed surface of the second metal layer.

In an embodiment, the material of first dielectric layer is made of silicon dioxide or Fluorinated Silica Glass (FSG).

In an embodiment, the portion exposed surface of the first metal layer is adjacent one side or two sides of the inner surface of the trench.

In an embodiment, the distance between the capacitance-insulating layer and the second metal layer and the inner surface of the trench is in range from 0.9 um to 1 um.

In an embodiment, the material of capacitance-insulating layer is made of silicon dioxide, silicon nitride, tantalum pentoxide ($Ta_2O_5$), aluminum oxide or other insulating material.

In an embodiment, the material of cap layer is made of silicon nitride (SiN) or silicon carbide (SiC).

In an embodiment, the material of second dielectric layer is made of Tantalum pentoxide ($Ta_2O_5$) or aluminum oxide ($Al_2O_3$).

In an embodiment, the conductive connecting structure is a single damascene structure or a dual damascene structure.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIG. 1 to FIG. 6 schematically illustrates the process flow for forming the embedded capacitor structure according to the present invention. Firstly, a first dielectric layer 12 is formed on the substrate 10. Then, a photoresist layer with a trench pattern (not shown) is formed over the first dielectric layer 12 by the optical lithography process. Next, an etching process is performed to remove the portion of the first dielectric layer 12 to form a trench 122 in the first dielectric layer 12 on the substrate 10. In this embodiment, the substrate 10 is silicon substrate, and the material of the first dielectric layer is made of silicon dioxide ($SiO_2$) or Fluorinated Silica Glass (FSG).

Figure 1:
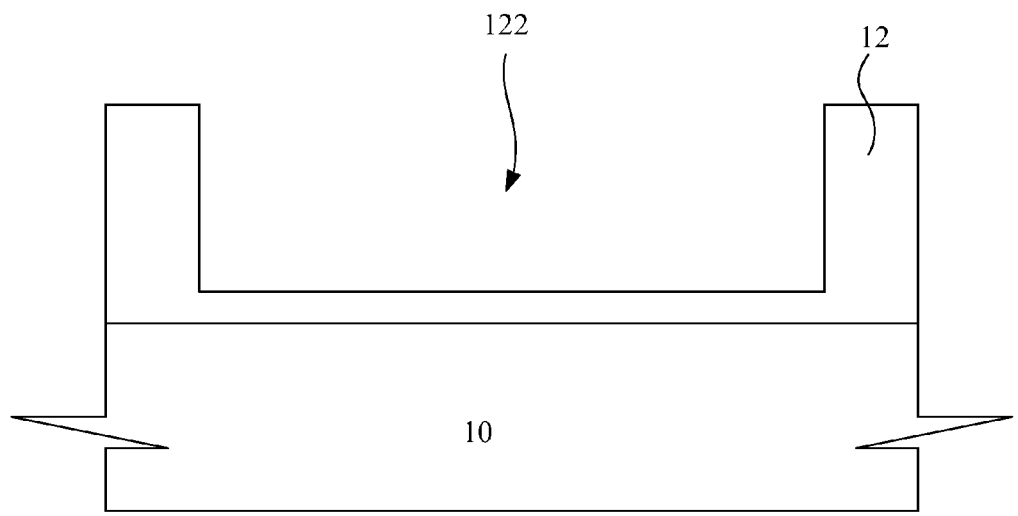
FIG. 1 schematically illustrates a dielectric layer having a trench therein on the substrate according to an embodiment of the present invention.
Figure 2:
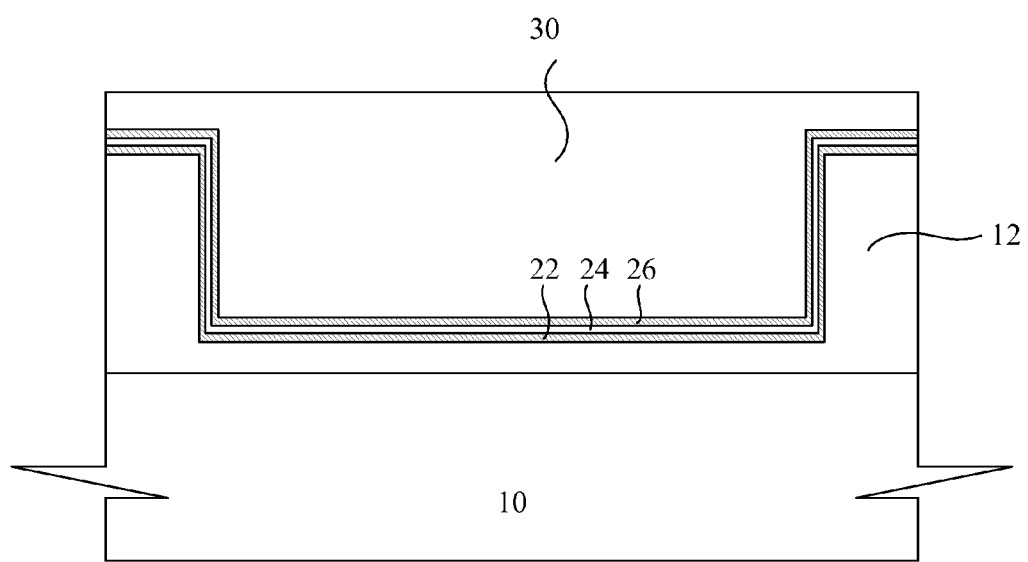
FIG. 2 schematically illustrates a first metal layer, a capacitance-insulating layer, a second metal layer and a bottom anti-reflection coating layer formed on the trench.

Please refers to FIG. 2. In FIG. 2, a first metal layer 22 is formed on a top surface, an inner surface and a bottom surface of the trench 122. Then, a capacitance-insulating layer 24 is formed on a surface of the first metal layer 22, and a second metal layer 26 is formed on a surface of the capacitance-insulating layer 24. In this embodiment, the material of the first metal layer 22 and the second metal layer 26 is made of tungsten (W), titanium (Ti), tungsten titanium (TiW), tantalum (Ta), tantalum nitride (TaN), aluminum (Al) copper (Cu), or the combination thereof. The first metal layer 22 and the second metal layer 26 are formed by chemical vapor deposition (CVD), physical vapor deposition (PVD), evaporation, plating or the combination thereof. The first metal layer 22 with a thickness is in around 1000 angstroms (depends on the requirement of the application on the bottom surface of the trench 122, and the second metal layer 26 with a thickness is in a range from 600 angstroms to 1000 angstroms (or depends on the requirement of the application) on the capacitance-insulating layer 24. The material of capacitance-insulating layer 24 is made of silicon dioxide ($SiO_2$), silicon nitride (SiN), Tantalum pentoxide ($Ta_2O_5$), aluminum oxide, or other insulating material. The capacitance-insulating layer is formed by CVD, PVD or other deposition method. The capacitance-insulating layer 24 with a thickness is in a range from 300 angstroms to 600 angstroms (or depends on the requirement of the application) between the first metal layer 22 and the second metal layer 26.

Please also refer to FIG. 2, in order to prevent the standing wave effect and notching effect of the photoresist layer to cause the interference effect for the incident light and reflection layer to introduce the inaccuracy of the lithography pattern transferring when the lithography process is performed, a bottom anti-reflection coating layer (BARC) 30 is formed on the second metal layer 26 and to fill with the trench 122. In this embodiment, the BARC layer 30 is formed by CVD or other deposition method. the material of the BARC layer 30 is made of silicon nitride (SiN), silicon dioxide ($SiO_2$), or silicon oxynitride (SiON).

Figure 3:
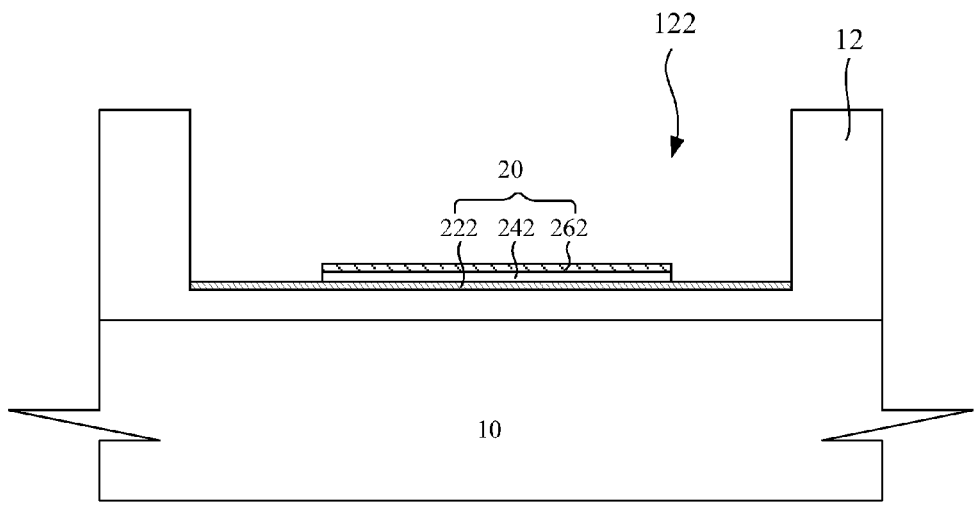
FIG. 3 schematically illustrates a capacitor structure formed on the bottom surface of the trench.

Next, a photoresist layer with a capacitor structure pattern (not shown) is formed over the BARC layer 30. An etching process is performed to remove the portion BARC layer 30, the portion of second metal layer 26, the portion of capacitance-insulating layer 24 and the portion of the first metal layer 22. Then, the remaining BARC layer 30 is fully removed, such that the first metal layer 222, the capacitance-insulating layer 242 and the second metal layer 262 are remained on the bottom surface of the trench 122. The portion surface of the first metal layer 222 is exposed and the first metal layer 222 is contacted with the inner surface of the trench 122 as shown in FIG. 3. In this embodiment, the portion of exposed surface of the first metal layer 222 is adjacent one side or two sides of the inner surface of the trench 122. In addition, the width for the portion of the exposed surface of the first metal layer 222 is a distance between the capacitance-insulating layer 242 and the second metal layer 262 and the inner surface of the trench 122, the distance is in range from 0.9 um to 1 um. Moreover, the first metal layer 222, the capacitance-insulating layer 242 and the second metal layer 262 is constructed a metal/insulator/metal capacitor structure 20.

Figure 4:
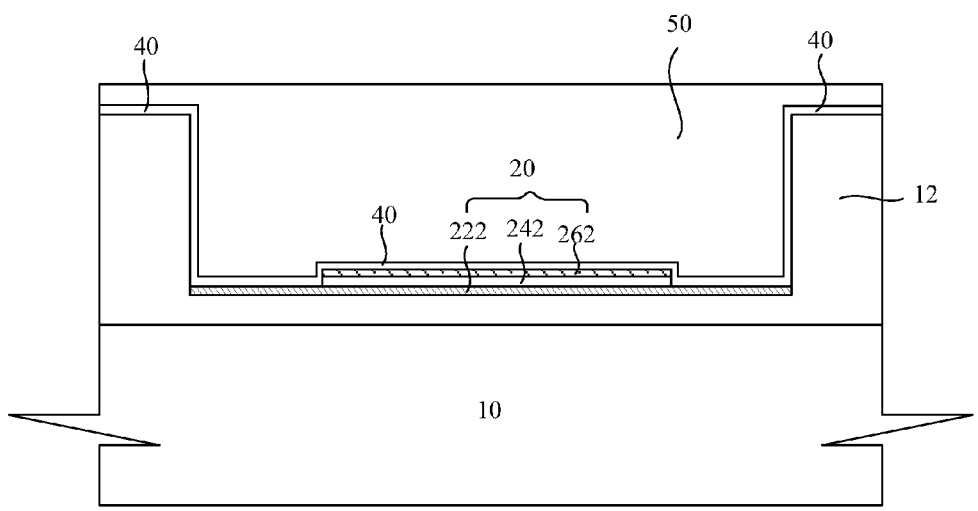
FIG. 4 schematically illustrates cap layer and a second dielectric layer formed on the inner surface of the trench and on the capacitor structure.

Please refer to FIG. 4. In FIG. 4, a cap layer 40 is formed on the top surface and the inner surface of the trench (not shown) and on the capacitor structure 20. The cap layer 40 is used as an etching stop layer for forming the contact window (not shown) in subsequent process. In this embodiment, the cap layer 40 is formed by CVD and the thickness is in a range 350 angstroms to 700 angstroms (or depends on the process capability). The material of cap layer 40 is made of silicon nitride (SiN) or Silicon Carbide (SiC). Next, please also refer to FIG. 4, a second dielectric layer 50 is formed on the cap layer 40 and to fill with the trench.

A chemical mechanical polishing process is performed to remove the unnecessary second dielectric layer 50 and the cap layer 40, and stop on the second dielectric layer 50 to expose the top surface of the trench, the portion surface of the second dielectric layer 50 and the portion surface of the cap layer 40. The material of the second dielectric layer 50 with higher dielectric constant is made of tantalum pentoxide ($Ta_2O_5$) or aluminum oxide ($Al_2O_3$). Thus, the higher dielectric constant of the dielectric layer has higher coupling efficiency to improve the capacitance density of the capacitor structure.

Figure 5:
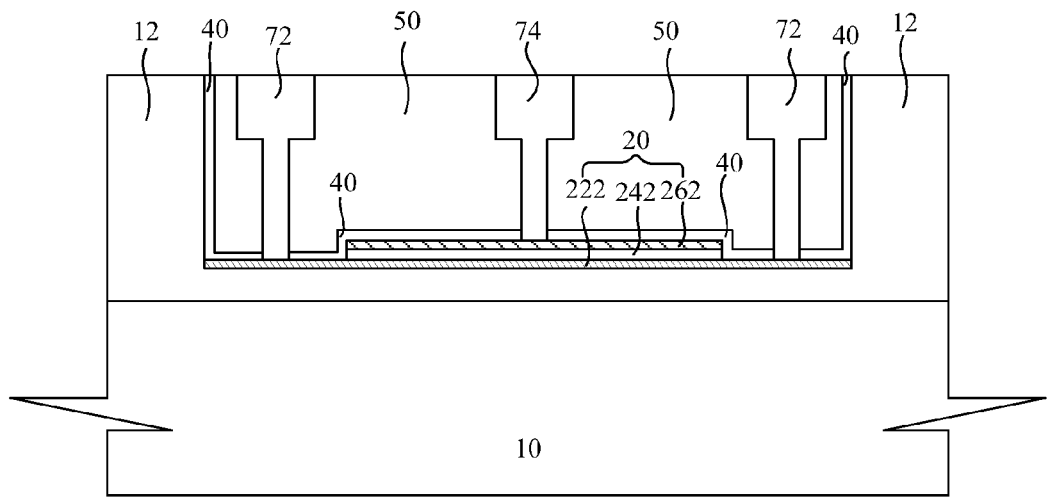
FIG. 5 schematically illustrates a contact window formed in the trench and on the capacitor structure.

Please refer to FIG. 5. A photoresist layer with a contact window pattern (not shown) is formed over the substrate 10. An etching process is performed to remove the portion of the second dielectric layer 50 and the portion of the cap layer 40 to form a first contact window 72 and a second contact window 74 within the second dielectric layer 50 and the cap layer 40. The first contact window 72 is formed on the first metal layer 222 and to expose the portion surface of the first metal layer 222, and the second contact window 74 is formed on the second metal layer 262 and to expose the portion surface of the second metal layer 262. In this embodiment, the first contact window 72 and/or the second contact window 74 is a single damascene structure or a dual damascene structure.

Figure 6:
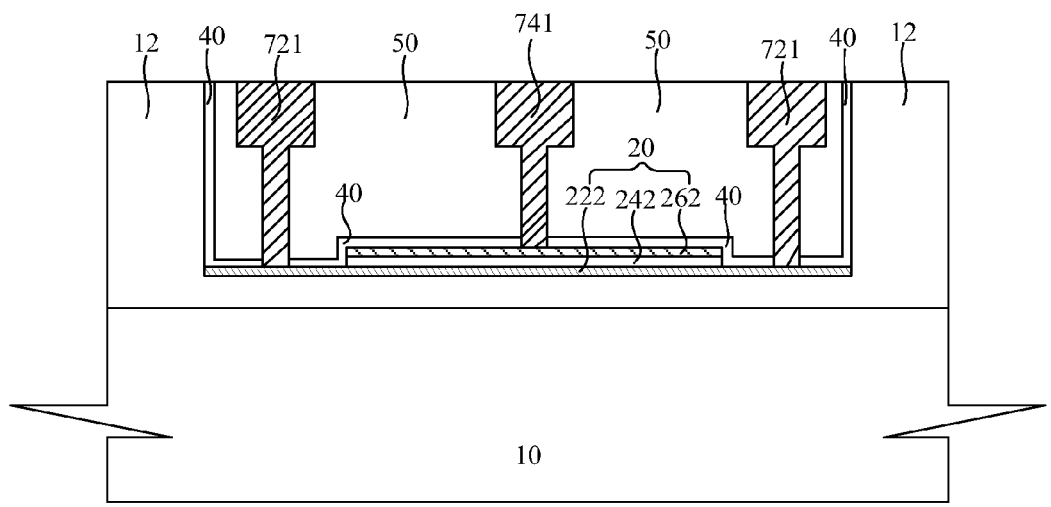
FIG. 6 schematically illustrates a metal layer formed in the contact window to form a conductive connecting structure in the trench and on the capacitor structure.

Then, please refer to FIG. 6, a metal layer for example Copper (Cu) is formed in the first contact window 72 and the second contact window 74 to form a first conductive connecting structure 721 and a second conductive connecting structure 741 respectively. Then, a planarization process such as CMP process is performed to remove the unnecessary metal layer to form a planar surface on the top of the metal layer. In this structure, one end of the first conductive connecting structure 721 is electrically connected with the first metal layer 222, and one end of the second conductive connecting structure 741 is electrically connected with the second metal layer 262 to accomplish the embedded capacitor structure. Furthermore, with reference to FIG. 6, the first metal layer 222 may be a flat bottom electrode of the embedded capacitor: the second metal layer 262 may be a flat top electrode of the embedded capacitor. Additionally the capacitance-insulating layer 242 is also of a flat structure between the flat top electrode and the flat bottom electrode.

According to abovementioned, the advantage is that the embedded capacitor structure is formed in the trench, such that the space structure for the chip can be reduced to increase the capacitance of the capacitor structure.

According to abovementioned, another advantage is that the method for forming the embedded capacitor structure only needs one deposition process of silicon nitride (SiN) to define the pattern of the embedded capacitor structure, such that the deposition processes of the silicon nitride can be reduced during the formation of the embedded capacitor structure. In addition, the forming processes of the embedded capacitor structure can compatible with the current manufacturing technology, so the process can be simplified and the cost can be reduced. In addition, the exposed region of the metal layer (the first metal layer or the second metal layer) is enough to allow the formation and alignment of the contact window thereon, thus the misalignment issue between the contact window and the metal layer can be reduced and the incomplete structure of the embedded capacitor would not be formed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming an embedded capacitor, comprising steps of:
   providing a first dielectric layer having a trench therein on a substrate;
   forming a capacitor structure embedded in the trench, the capacitor structure comprising a first metal layer, a second metal layer and a flat capacitance-insulating layer therebetween, wherein the first metal layer and the second metal layer are respectively a flat bottom electrode and a flat top electrode of the capacitor structure;
   forming a cap layer lining sidewalls of the trench and covering the capacitor structure;
   forming a second dielectric layer on the cap layer; and
   removing a portion of the second dielectric layer and a portion of the cap layer to form a plurality of contact windows, wherein the first metal layer and the second metal layer are uncovered by the cap layer in the plurality of contact windows.

2. The method according to claim 1, wherein the material of the first dielectric layer is made of silicon dioxide (SiO$_2$) or Fluorinated Silica Glass (FSG).

3. The method according to claim 1, wherein the step of forming the capacitor structure comprising:
   forming the first metal layer lining a top surface, the sidewalls and a bottom surface of the trench;
   forming the capacitance-insulating layer on a surface of the first metal layer;
   forming the second metal layer on a surface of the capacitance-insulating layer;
   forming a bottom anti-reflection coating layer on a surface of the second metal layer and to fill the trench;
   forming a photoresist layer with a capacitor structure pattern over the bottom anti-reflection coating layer;
   etching to remove the bottom anti-reflection coating layer, and partially remove the second metal layer, the capacitance-insulating layer and the first metal layer to form the capacitor structure on the bottom surface of the trench, and to expose a partial surface of the first metal layer and the surface of the second metal layer in the trench.

4. The method according to claim 3, wherein the bottom anti-reflection coating layer is made of silicon nitride (SIN), silicon dioxide (SiO$_2$) or silicon oxynitride (SiON).

5. The method according to claim 1, wherein the first metal layer on the bottom surface of the trench contacts with the sidewalls of the trench.

6. The method according to claim 1, wherein the first metal layer has a thickness of substantially 1000 angstroms.

7. The method according to claim 1, wherein the capacitance-insulating layer has a thickness in a range from 300 angstroms to 600 angstroms.

8. The method according to claim 1, wherein the second metal layer has a thickness in a range from 600 angstroms to 1000 angstroms.

9. The method according to claim 1, wherein the cap layer has a thickness in a range from 350 angstroms to 700 angstroms.

10. The method according to claim 1, further comprising a step of forming a metal layer in the plurality of contact windows to form a plurality of conductive connecting structures.

11. The method according to claim 10, wherein the conductive connecting structures are single damascene structures or dual damascene structures.

12. The method according to claim 10, wherein two conductive connecting structures are directly connected to the first metal layer.

13. An embedded capacitor structure, comprising:
   a substrate having a first dielectric layer thereon and a trench in the first dielectric layer;
   a capacitor structure embedded in the trench, the capacitor structure comprising a first metal layer, a second metal layer and a flat capacitance-insulating layer therebetween, wherein the first metal layer and the second metal layer are respectively a flat bottom electrode and a flat top electrode of the capacitor structure and there is a distance between sidewalls of the trench and the capacitance-insulating layer and the second metal layer;
   a cap layer formed to line the sidewalls of the trench and cover the capacitor structure;
   a second dielectric layer formed on the cap layer; and
   a plurality of conductive connecting structures formed within the second dielectric layer and the cap layer, wherein a portion of the conductive connecting structures electrically connect with the first metal layer and the other portions of the conductive connecting structures electrically connect with the second metal layer.

14. The embedded capacitor structure according to claim 13, wherein the first dielectric layer is made of silicon dioxide or Fluorinated Silica Glass (FSG).

15. The embedded capacitor structure according to claim 13, wherein a partial surface of the first metal layer uncovered by the capacitance-insulating layer is adjacent to one side or two sides of the sidewalls of the trench.

16. The embedded capacitor structure according to claim 13, wherein the distance between the sidewalls of the trench and the capacitance-insulating layer and the second metal layer is in range from 0.9 μm to 1 μm.

17. The embedded capacitor structure according to claim 13, wherein the capacitance-insulating layer is made of silicon dioxide ($SiO_2$), silicon nitride (SiN), tantalum pentoxide ($Ta_2O_5$), aluminum oxide or other insulating material.

18. The embedded capacitor structure according to claim 13, wherein the cap layer is made of silicon nitride (SiN) or silicon carbide (SiC).

19. The embedded capacitor structure according to claim 13, wherein the second dielectric layer is made of tantalum pentoxide ($Ta_2O_5$) or aluminum oxide ($Al_2O_3$).

20. The embedded capacitor structure according to claim 13, wherein the conductive connecting structures are a single damascene structure or a dual damascene structure.

21. The embedded capacitor structure according to claim 13, wherein two conductive connecting structures are directly connected to the first metal layer.

\* \* \* \* \*